United States Patent
Spano' et al.

(10) Patent No.: US 9,786,799 B2
(45) Date of Patent: Oct. 10, 2017

(54) PROCESS FOR THE PRODUCTION OF AN OPTICALLY SELECTIVE COATING OF A SUBSTRATE FOR HIGH TEMPERATURE RECEIVER SOLAR DEVICES AND RELATIVE MATERIAL OBTAINED

(71) Applicant: ENI S.P.A., Rome (IT)

(72) Inventors: Guido Spano', Galliate (IT); Carla Lazzari, Cornaredo (IT); Marcello Marella, Venice (IT)

(73) Assignee: Eni S.P.A., Rome (IT)

( * ) Notice: Subject to any disclaimer, the term of this patent is extended or adjusted under 35 U.S.C. 154(b) by 298 days.

(21) Appl. No.: 14/427,863

(22) PCT Filed: Sep. 18, 2013

(86) PCT No.: PCT/EP2013/069386
§ 371 (c)(1),
(2) Date: Mar. 12, 2015

(87) PCT Pub. No.: WO2014/044712
PCT Pub. Date: Mar. 27, 2014

(65) Prior Publication Data
US 2015/0249165 A1    Sep. 3, 2015

(30) Foreign Application Priority Data
Sep. 21, 2012 (IT) ............... MI2012A1572

(51) Int. Cl.
*C23C 14/00* (2006.01)
*H01L 31/0216* (2014.01)
(Continued)

(52) U.S. Cl.
CPC .... H01L 31/02168 (2013.01); *C23C 14/0688* (2013.01); *C23C 14/16* (2013.01);
(Continued)

(58) Field of Classification Search
CPC ............................................. C23C 14/0688
See application file for complete search history.

(56) References Cited

U.S. PATENT DOCUMENTS 5,670,248 A    9/1997   Lazarov et al.
5,776,556 A    7/1998   Lazarov et al.
5,912,045 A    6/1999   Eisenhammer et al.

FOREIGN PATENT DOCUMENTS

EP    0104708 A2    4/1984
WO    2009107157    4/2009
WO    2009051595    9/2009

OTHER PUBLICATIONS

Chester, David; "Design and global optimization of high-efficiency solar thermal systems with tungsten cermets" May 9, 2011, Optics Express, vol. 19, No. S3, p. A245-A257.*
"Progress to Develop an Advanced Solar Selective Coating" [14th Biennial CSP Solar PACES Symposium, Mar. 4-7, 2008, Las Vegas, Nevada, USA (NRELLACD-550-42709).
C.E. Kennedy, "Review of Mid- to High-Temperature Solar Selective Absorber Materials", (NREL Technical Report 520-31267, Jul. 2002).

(Continued)

*Primary Examiner* — Timon Wanga
(74) *Attorney, Agent, or Firm* — Abel Law Group, LLP

(57) ABSTRACT

A process for the production of an optically selective coating of a receiver substrate of a suitable material for solar receiver devices particularly suitable for operating at high temperatures, more specifically for receiver tubes of linear parabolic trough, which comprises: deposition of a layer reflecting infrared radiation consisting of a high-melting metal on a heated receiver substrate of a suitable material; annealing under the same temperature and pressure conditions as the deposition of the reflecting layer; deposition on the high-melting metal of one or more layers of metal-ceramic composite materials (CERMET), wherein the metal is W and the ceramic matrix is YPSZ ("Yttria-Partially Stabilized Zirconia"); deposition on the cermet of an anti-reflection layer; annealing under the same temperature and pressure conditions as the depositions of the cermet and antireflection layers.

20 Claims, 6 Drawing Sheets

(51) Int. Cl.
  C23C 14/06      (2006.01)
  C23C 14/16      (2006.01)
  C23C 14/34      (2006.01)
  C23C 28/00      (2006.01)
  F24J 2/48       (2006.01)
  G02B 1/14       (2015.01)
  G02B 1/113      (2015.01)
  G02B 5/20       (2006.01)

(52) U.S. Cl.
  CPC .......... *C23C 14/34* (2013.01); *C23C 14/3464* (2013.01); *C23C 28/322* (2013.01); *C23C 28/3455* (2013.01); *F24J 2/485* (2013.01); *G02B 1/113* (2013.01); *G02B 1/14* (2015.01); *G02B 5/208* (2013.01); *Y02E 10/40* (2013.01)

(56) References Cited

OTHER PUBLICATIONS

Martin et al. "Spectrally Selective PbS Films produced by Ion Beam Sputtering", Thin Solid Films 87 (1982) 203.
Solar Energy Materials & Solar Cells 98 (2012) 1-23.
Sathiaraj, T. Stephen, R. Thangaraj, and O. P. Agnihotri. "Ni—Al 2 O 3 cermet solar absorbers by RF planar magnetron sputtering for high temperature applications." Solar energy materials 18.6 (1989): 343-356.
International Search Report dated Dec. 6, 2013 for PCT/EP2013/069386.

* cited by examiner

PROCESS FOR THE PRODUCTION OF AN OPTICALLY SELECTIVE COATING OF A SUBSTRATE FOR HIGH TEMPERATURE RECEIVER SOLAR DEVICES AND RELATIVE MATERIAL OBTAINED

The present invention relates to a process for the production of an optically selective coating of a substrate for receiver devices operating at high temperatures suitable for absorbing solar radiation in electric energy production plants.

In concentrated solar thermal plants, the solar radiation is concentrated on the receiver device which converts it into thermal energy stored by a thermovector fluid. In order to optimize the energy conversion process, this device must be able to withstand high temperatures, maximize the absorption of solar radiation and at the same time minimize the energy loss of the radiating emission due to the high temperature.

For this purpose, the receiver can be covered with a thin coating having a suitable formulation which has peculiar optical characteristics and gives a high absorbance to the receiver within the electromagnetic spectrum range which includes solar radiation and a low emissivity within the range of infrared thermal radiation. The optical characteristics of this material must tend towards the ideal model and are represented by a 100% absorptance ($\alpha=1$, reflectance 0%) within the solar irradiance range and emissivity 0% ($\epsilon=0$, reflectance 100%) within the thermal emittance range. The ideal positioning, with the spectral range considered, of this marked discontinuity of these properties depends on the operating temperature and is conveniently positioned at a wavelength of about 2 microns (2,000 nanometers).

Solar plants currently operating in the world operate at temperatures of up to about 400° C. but to ensure the overall efficiency of the plant, they tend to be increased up to 550° C. or over.

The increase in temperature collides with a series of technological problems, of which one is certainly represented by the thermal, chemical and mechanical resistance of the coating of the receiver device and also its optical efficiency which, as previously said, requires a high solar absorbance and a minimum thermal emissivity.

C. E. Kennedy, "Review of Mid- to High-Temperature Solar Selective Absorber Materials", (NREL Technical Report 520-31267, July 2002) provides a wide analysis of technical solutions for the production of selective coatings, also concentrating on the temperatures at which these devices can operate.

Among the most interesting solutions, multilayer coatings based on "CERMET" are mentioned: Cermet is a nanostructured composite material of a metal dispersed into a ceramic matrix. The layers of the coating have thicknesses of tens/hundreds of nanometers and, through the interference of the refracted and reflected components of the incident radiation, cause the discontinuity of the optical properties previously mentioned.

The architecture of the multilayer is generally composed of a first metallic reflecting layer, a series of two or more layers of CERMET with a variable refraction index and a final antireflection layer generally consisting, for example, of $SiO_2$ or the same ceramic material already used in the composite. There are numerous methods for depositing this multilayer on the receiver device, in industrial practice the most convenient and efficient method consists of plasma evaporation (sputtering).

In WO-2009/051595, even if in a purely planning phase, a huge amount of oxides and ceramics such as $TiO_2$, $HfO_2$, $Y_2O_3$ $ZrO_2$ $Ta_2O_5$ and again the corresponding borides, nitrides and oxy-nitrides combined with Au, Ag, Ta, W, Mo are suggested for the preparation of CERMET, exploiting the respective chemical, thermal and reflecting properties. In some cases, the research goes as far as theoretically modelling a possible combination of these materials. In particular, the calculation on the combination $W/ZrO_2$ is presented and considered promising, which, however, is modelled as a metal-ceramic multilayer and not as CERMET (metal dispersed in a ceramic matrix). At the same time, it is asserted that the expected interest for certain combinations based on the physico-chemical characteristics of the components is not confirmed in the theoretical modelling (as is the case for $Pt/ZrO_2$). The document, in fact, claims a composite (multilayer or cermet) in which the IR reflecting layer is at least a titanium silicide, optionally a noble metal and the absorbing layers consist of oxides or oxynitrides of metals and semi-metals. The metallic oxides can be oxides of Ti, Zr, Hf, V, Nb, Ta, Cr, Mo or W. The refractory metal silicide consists of at least one Titanium silicide having formula $Ti_xSi_y$, wherein x=1, 3, 5 e y=1, 2, 4.

The same speculative level is present in the already cited review NREL Technical Report 520-31267, July 2002. In Table 2, high-temperature materials are listed, providing a ranking on the basis of their stability. Cermet $W-Al_2O_3$ on a steel substrate, W—AlN on a substrate of Cu, $ZrO_x/ZrC_x/$ Zr on stainless steel are among the materials with the highest ranking.

It is known, on the other hand, that $ZrO_2$ is extremely mechanically resistant and is a compound widely used at high temperatures as a coating for thermal barriers (Thermal Barrier Coating). In M. P. Lazarov and I.V. Mayer, U.S. Pat. No. 5,670,248 and U.S. Pat. No. 5,776,556, a coating based on $ZrN_xO_y$ deposited by sputtering on steel thermally stable up to 600° C., is claimed, inter alia.

Martin et al. ["Spectrally Selective PbS Films produced by Ion Beam Sputtering", Thin Solid Films 87 (1982) 203] have prepared PbS thin films with an antireflection coating of $ZrO_2$ with various techniques, "ion beam sputtering", "electron beam evaporation" and "thermal evaporation", and compared the optical properties of these films for low operating temperatures. With respect to the materials prepared without the addition of antireflection layer, the hardness and absorptance are increased and absorptance values ranging from 66% to 80% are reached.

WO-2009/107157 claims a method for the preparation of a coating based on CERMET composed of W dispersed in $Al_2O_3$ at a variable concentration, in which the infrared reflecting metallic layer consists of the same W and the anti-reflection layer consists of $Al_2O_3$ or $SiO_2$. The technique used is a DC-RF co-sputtering with sources of W and of $Al_2O_3$ respectively, or, alternatively, a DC reactive sputtering starting from metallic targets of W and Al. An important feature of the invention is the deposition of W in $\alpha$ phase, necessary for maximizing the reflection of the infrared radiation. This is possible and specifically claimed through a preliminary deposition of a matching layer capable of orienting the growth of the reflecting $\alpha$-W phase.

Matching layers are used extensively in the thin film deposition technique to gradually compensate any lattice mismatch at the interface, favouring the epitaxial growth which improves the characteristics including the mechanical properties. They represent, however, an additional process complication in sequential depositions. The possibility of doing without them is certainly an advantage provided the deposited layer has the characteristics designed and remains firmly bound to the substrate when operating.

The industrial state of the art for the production and commercialization of coatings for receivers has been reviewed in a recent survey [Solar Energy Materials & Solar Cells 98 (2012) 1-23]. The selective coatings currently available on the market and compatible with high temperatures can now claim absorbances that tend towards 1 ($\alpha$=0.96), the emissivities, however, are still higher than 10% and for particularly high temperatures (550° C.) $\epsilon$=0.14.

In this respect, it can be noted, as also indicated in "Progress to Develop an Advanced Solar Selective Coating" [14$^{th}$ Biennial CSP Solar PACES Symposium, 4-7 Mar. 2008, Las Vegas, Nev., USA (NRELLACD-550-42709)] that in the real operation of a solar plant and especially for plants that operate at final temperatures higher than 500° C., the heat losses by irradiation have a considerable effect on the overall efficiency of the energy conversion process. It has in fact been calculated that under the average operating conditions and for the purposes of the enthalpic balance, one percentage point of emissivity corresponds to at least 1.2 percentage points of absorbance. In other words, gaining one point of $\epsilon$ and losing 1.2 points of $\alpha$ does not influence the efficiency of the plant.

Furthermore, in the absence of solar irradiation, the opportunity of minimizing the cooling of the convector fluid due to the heat emission is particularly appreciated when operating at high temperatures.

The state of the art therefore still shows high emissivity values and, on the other hand, the convenience, above all at high temperatures, of limiting the emissivity, even possibly to the detriment of the absorbance.

An optically selective coating material for substrates or receiver tubes of linear parabolic troughs as now been obtained by means of a new process, which allows high absorbance vales to be obtained together with optimum emissivity values.

Under this aspect, a particular feature of the present invention is to have, together with an absorbance ($\alpha$=0.893), slightly lower than that of the state of the art, a much lower emissivity than that cited above, equal to $\epsilon$=0.087 (at 550° C.), thus acquiring a gain in emissivity which compensates the loss in absorbance with respect to the known art.

A second aspect of the present invention is that it has been surprisingly found that coatings of W in $\alpha$ phase can be obtained without the use of matching layers.

An object of the present invention relates to a process for the production of an optically selective coating of a receiver substrate of suitable material for solar receiver devices particularly suitable for operating at high temperatures, more specifically for receiver tubes of linear parabolic troughs, which comprises:
  deposition of a layer reflecting infrared radiation consisting of a high-melting metal, preferably W, on said heated receiver substrate;
  annealing under the same temperature and pressure conditions as the deposition of the reflecting layer;
  deposition on the high-melting metal of one or more layers of metal-ceramic composite materials (CERMET), wherein the metal is W and the ceramic matrix is YPSZ ("Yttria-Partially Stabilized Zirconia");
  deposition on the cermet of an antireflection layer, preferably consisting of YPSZ;
  annealing under the same temperature and pressure conditions as the depositions of the cermet and antireflection layer.

The substrate of a suitable material, which can be, in particular, a receiver tube of linear parabolic troughs for high temperatures, preferably consists of stainless steel, more preferably AISI 316L, AISI 316H, AISI316Ti or AISI 321 grade.

The depositions of the reflecting layer, cermet layer and antireflection layer are preferably carried out by combined DC/RF sputtering in a single chamber with movement of the substrate above the two single sources or above both. The target of the DC magnetron source preferably consists of W, whereas that of the RF magnetron source preferably consists of YPSZ.

An aspect of the present invention is obtaining the W $\alpha$-phase without the help of the preliminary deposition of any matching layer.

It has also been surprisingly observed that the growth of the W $\alpha$-phase can also take place on a polished substrate and said polishing also optimizes the reflecting properties of infrared radiation without jeopardizing the mechanical properties of the layer. The polishing of the substrate can be carried out with methods known to experts in the field, with an abrasive having dimensions not greater than 0.20 microns.

The process, object of the present invention is now described in greater detail. The reflecting layer of W is prepared by means of the following steps in sequence:
  initial vacuum level in the chamber sufficient for preventing oxygen contaminations;
  pre-sputtering of the W target;
  heating of the substrate;
  sputtering and low-velocity oscillation of the sample-holder around the source of W;
  annealing at the same deposition temperature and at the same sputtering pressure.

The heating of the substrate is one of the most important characteristics of the process developed. The phases which lead to a compact columnar structure are: adsorption from vapour phase of the W atoms on the substrate, formation of small clusters still having mobility, growth of the clusters in nuclei having a lesser mobility or stationary, transformation of the nuclei into stable islands which grow upwards and on the sides, subsequently coalescing with the nearby islands to form a continuous film. After adsorption of the atoms on the surface, the structure of the film in the growth phase is mainly determined by the facility with which these atoms move on the surface itself. The temperature of the substrate directly influences this diffusion rate on the surface, also called mobility.

Oscillation at a low velocity (<1 cm/s) is another important feature for assuring a growth homogeneity of the film. For samples having extensive areas, a greater homogeneity is obtained by this oscillation, with respect to a simple rotation of the sample on its axis. The deposition rate on the substrate, in fact, depends on the velocity at which the atoms reach the substrate and their adhesion coefficient. The arrival rate depends on the vapour pressure of the material which condenses on the substrate, which can be correlated with the vapour pressure at the source and the source-substrate distance by means of the following equation:

$$P_{substrate} = P_{evap} A \cos \phi \cos \theta / \pi R^2$$

wherein:
  $P_{substrate}$=vapour pressure on the substrate
  $P_{evap}$=vapour pressure of the evaporating substance at the temperature of the source
  A=area of the evaporating substance at the source φ=emission angle of the vapour from the source (perpendicular=0°)
θ=incidence angle on the substrate (perpendicular=0°)
R=source-substrate distance.

From this equation, it emerges that, once all the other conditions have been pre-established, the oscillation of the substrate allows the cos θ to be averaged on the different incidence angles in the various areas of the sample, thus allowing the thickness to be homogenized on the whole surface.

The W α—phase with high reflectance properties within the infrared range can be prepared assuring the following conditions:
  polishing of the substrate with an abrasive, preferably having dimensions not greater than 0.20 microns;
  the initial vacuum level in the chamber adjusted at a pressure ranging from $1 \times 10^{-6}$ mbar to $5 \times 10^{-6}$ mbar, preferably from $3 \times 10^{-6}$ mbar to $4 \times 10^{-6}$ mbar;
  pre-sputtering of the W target at a low power, preferably ranging from 15 W to 25 W, more preferably at 20 W, and for a short time, preferably ranging from 8' to 12', more preferably from 9' to 10';
  heating of the substrate or receiver tube from 400° C. to 600° C., preferably from 485° C. to 515° C.;
  sputtering at a residual pressure Ar 6N ranging from $2.7 \times 10^{-2}$ mbar to $3.2 \times 10^{-2}$ mbar, preferably $3 \times 10^{-2}$ mbar, contemporaneously making the substrate oscillate above the DC source at a rate ranging from 0.1 cm/s to 1 cm/s, more preferably from 0.4 cm/s to 0.6 cm/s;
  annealing for a time ranging from 0.5 h to 2 h, preferably from 0.8 to 1.2 h, at the same temperature and pressure as the sputtering, so as to obtain the layer of W, prevalently in α phase, with a thickness ranging from 200 nm to 900 nm, preferably from 750 to 850 nm.

It is advisable to carry out the annealing at the same deposition temperature since, if using lower temperatures, the treatment times would have to be prolonged unacceptably for the process, and viceversa, with an increase in temperature, there would be a serious risk of accelerating sintering phenomena of the film structure with a consequent detachment from the substrate. The best results are obtained with times of about 1 hour.

As far as the deposition of the cermet is concerned, it has been found that coatings with good emissivity characteristics can be obtained without preparing layers with a metal/ceramic concentration gradient.

The main advantages of the process consist of the fact that a single deposition chamber is used and that all the selective coating layers are deposited at the same temperature, with an evident reduction in the process costs.

The cermet layer is prepared by means of the following steps in sequence:
  pre-sputtering of the YPSZ target;
  heating of the substrate;
  co-sputtering and oscillation of the sample-holder above the W and YPSZ sources;
  annealing at the same deposition temperature and same sputtering pressure.

Since the deposition of the cermet follows that of W, it is not necessary to carry out a pre-sputtering of W and, also with respect to the heating of the substrate, this must simply be kept at the same temperature as the deposition temperature of the previous layer.

The cermet layer consists of W, preferably dispersed on a nanometric scale, more preferably in a quantity ranging from 30 to 70% by volume, in a matrix of YPSZ, in a quantity ranging from 70 to 30% by volume.

A second cermet layer, preferably consisting of W dispersed on a nanometric scale, can be possibly deposited, more preferably prepared in a quantity ranging from 20 to 60% by volume of W, in a matrix of YPSZ, in a quantity ranging from 80 to 40% by volume, the volume percentage of W in said second layer being lower with respect to the layer of cermet previously deposited.

The second layer of cermet can be prepared by means of the following steps in sequence:
  maintaining the heating of the substrate or receiver tube;
  sputtering and oscillation of the substrate around the W and YPSZ sources whose power has been varied in relation to the new volumetric ratio of the cermet;
  annealing at the deposition temperature and same sputtering pressure.

The pre-sputtering of the YPSZ target can be carried out at a low power, preferably ranging from 40 W to 45 W, for a short time, preferably ranging from 8' to 12'.

In particular, the single or double cermet layers are prepared assuring the following conditions:
  heating of the substrate or receiver tube from 400° C. to 600° C., preferably from 485° C. to 515° C.;
  co-sputtering at a residual pressure Ar 6N ranging from 2.7 to $3.2 \times 10^{-2}$ mbar, preferably $3 \times 10^{-2}$ mbar, contemporaneously making the stainless steel substrate oscillate between the DC and RF sources at a speed ranging from 5 cm/s to 15 cm/s, preferably from 8 cm/s to 12 cm/s;
  annealing for a time ranging from 0.5 h to 1 h, preferably 0.5 h, at the same deposition temperature and same sputtering pressure, in order to obtain a cermet layer with a thickness ranging from 50 nm to 150 nm, preferably from 80 to 120 nm.

When two cermet layers are deposited in sequence, the relative powers of the two DC and RF sources are simply changed and an intermediate annealing is not carried out but only the final annealing.

The antireflection layer (ARL) can be prepared by means of the following steps in sequence:
  maintaining the heating of the substrate;
  sputtering and oscillation of the sample-holder at a low velocity above the source of YPSZ alone;
  annealing at the deposition temperature and at the same sputtering pressure.

In particular, the ARL can be prepared assuring the following conditions:
  heating of the substrate or receiver tube within the range of 400° C.-600° C., preferably from 485° C. to 515° C.;
  sputtering at a residual pressure Ar 6N ranging from $2.7 \times 10^{-2}$ mbar to $3.2 \times 10^{-2}$ mbar, preferably $3 \times 10^{-2}$ mbar, contemporaneously making the substrate oscillate above the RF source at a low velocity ranging from 0.1 cm/s to 1 cm/s, preferably from 0.4 cm/s to 0.6 cm/s;
  annealing for a time ranging from 0.2 h to 1 h, preferably from 0.4 h to 0.6 h, at the same deposition temperature and at the same sputtering pressure.

Also in this case, it is simply a matter of maintaining the heating at the same temperature as the previous layers and a pre-sputtering of the YPSZ target is not required. Furthermore, the intermediate annealing of the layers of cermet can be optionally eliminated in favour of the final annealing after deposition of the ARL.

A second object of the present invention relates to the optically selective coating material of a receiver substrate, which can be, in particular, a high temperature receiver tube of linear parabolic troughs, obtained by means of the process described above.

Said material is composed of a multilayer structure comprising:
- an upper layer of antireflection material;
- a lower layer of material reflecting in the infrared consisting of a high-melting metal;
- at least one intermediate layer of metal-ceramic composite material (CERMET), wherein the metal is W and the ceramic matrix is YPSZ ("Yttria-Partially Stabilized Zirconia").

The antireflection material is preferably YPSZ, the material reflecting in the infrared is W, the W in the cermet ranging from 30% to 70% and the ceramic material ranging from 70% to 30% by volume.

Said material has absorptance values $\alpha$ and hemispherical emissivity values $\epsilon_H$, at a temperature of 550° C., of 0.893 and 0.087, respectively.

The material obtained with the process according to the invention can also be used as a selective coating in thermoelectric converter absorbers and generally in all cases of absorber devices in which, together with a high absorption of solar radiation, it is also necessary to minimize the radiating emission deriving from heating the device itself to high temperatures.

The subject matter of the disclosure will now be described by reference to the accompanying drawings.

Some examples are provided, which describe the invention and which should in no way be considered as limiting the invention itself.

EXAMPLES

The examples were carried out using the preferred embodiment which is described hereunder, and which should not be considered as limiting the scope of the invention.

Figure 1:
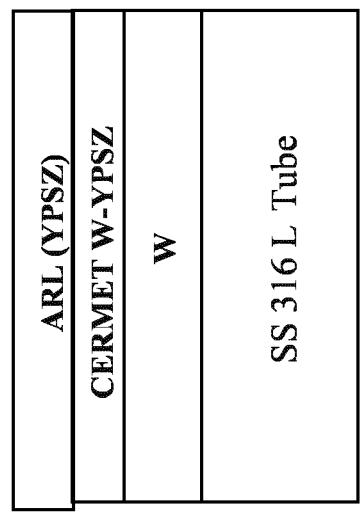
FIG. 1: Shows a multilayer coating of a substrate described in Example 1 of the specification.

The multilayer produced is schematically represented in FIG. 1 in which there is:
- a substrate: 316 L stainless steel tube;
- a layer reflecting in the infrared: W;
- a layer absorbing concentrated solar irradiation: W-YPSZ ("Yttria-Partially Stabilized Zirconia") cermet;
- an anti reflective layer (ARL): YPSZ.

This is a selective coating designed for high operating temperatures, within an operating range of 450° C. to 600° C.

Figure 2:
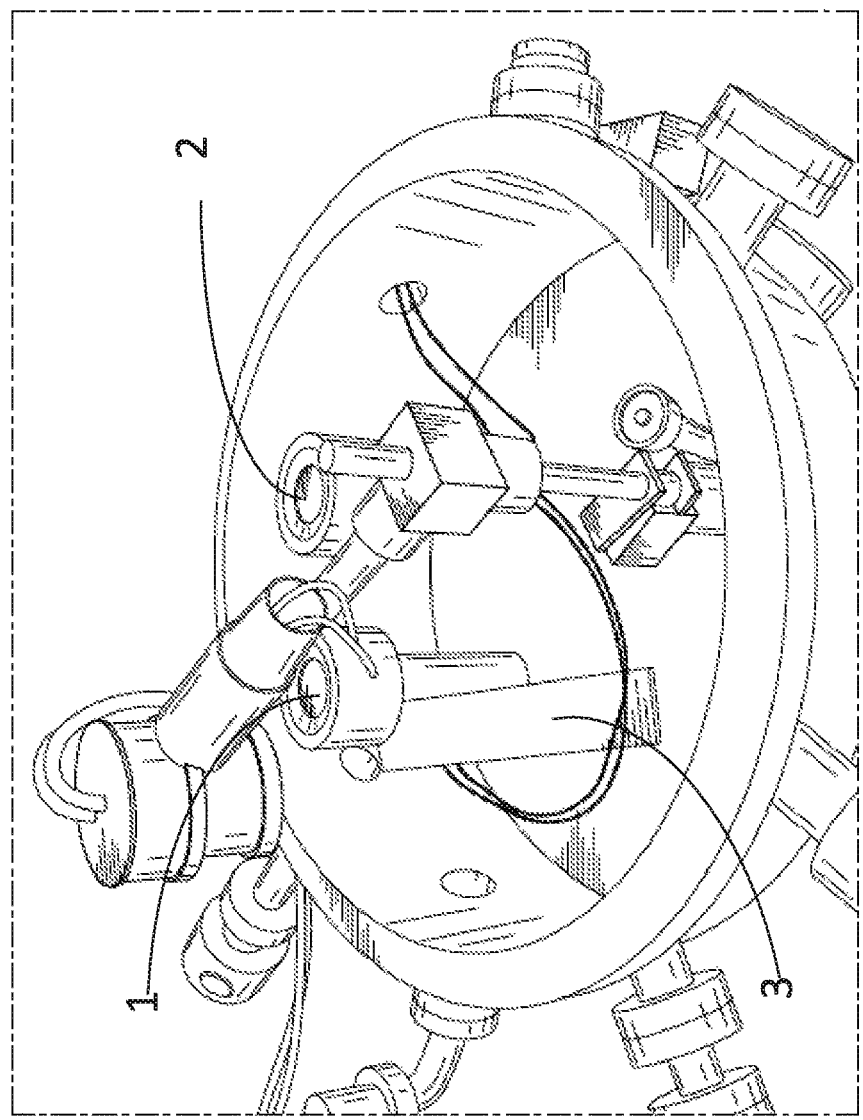
FIG. 2: Shows an interior of a deposition chamber depicting a heated and rotating sample holder and magnetron sources with a target of W and YPSZ as described in Example 1 of the specification.

The deposition technique is DC/RF co-sputtering, starting from a target of W and YPSZ. All the layers of FIG. 1 are deposited in sequence on the AISI 316L substrate heated to a suitable temperature. The interior of the deposition chamber is shown in FIG. 2 which shows the heated and rotating sample-holder in the top left and the magnetron sources with a target of W1 and YPSZ2, in the centre.

The planar substrate is positioned on the bottom of the heater by means of a bayonet system and can be seen through the mirror 3 positioned on the bottom of the chamber. A thermocouple is fixed on the opposite side, in contact with the substrate, for the deposition temperature control. The sample can oscillate above a single source or both sources, by means of an arm connected to an external motor, with programmable amplitudes and oscillation rates.

The extension of the experimentation with tubular substrates is possible using magnetron sources with a folding head oriented towards the tubular substrate which is rotated and translated at a controlled speed. This type of configuration can be easily implemented by an expert in the field inside our deposition chamber and consequently should in no way be considered as limiting the invention itself.

The feeding of the two magnetron sources is effected by means of two power supplies of "Materials Science, Inc." (San Diego, Calif.). The DC power supply is the model ION 1500™, capable of supplying a maximum power of 1500 W. The RF power supply is the model of the series PB-3 of Manitou Systems Inc., which integrates the actual power supply and the impedance matching network in a single unit. This generator supplies a maximum RF output of 300 W at the fixed operating frequency of 13.56 MHz. The two sputtering sources Polaris Gen II allow standard targets to be assembled having a diameter of 2" and a thickness ranging from 3.1 to 4.8 mm. The targets are glued onto the copper back plate by means of a silver paste. The magnetron sources are cooled by means of a HAAKE cryostat.

Other accessory equipment consists of: a turbomolecular high-vacuum pump, 2 rotary vane pumps, chamber vacuum level gauges and a quadrupole mass. The sample is heated by means of a power Variac connected to a programmer.

The targets are crucial for obtaining a high-quality multilayer.

The W target is product by Plansee at 4 N purity levels. The main impurity consists of 100 ppm of Mo which, in this case, cannot be considered a pollutant. The YPSZ targets were prepared starting from Tosoh Zirconia TZ-3Y powders, shaped by monodirectional pressing and sintered at 1600° C. in air in a Linn HT1800MVAC high-temperature oven. A polishing process of the surface completes the finishing before sealing on the magnetron source. The chemical composition of the target, zirconia stabilized partially with 3% molar $Y_2O_3$, is essential for the following reasons:
- it stabilizes the tetragonal phase;
- it allows a crystalline phase to be obtained with a greater mechanical resistance;
- it reduces the tendency to have non-homogeneous refraction index gradients, shown by pure $ZrO_2$.

The second reason is technologically useful for withstanding the significant thermo-mechanical stress to which the target is subjected during sputtering in radiofrequency. The third is essential for obtaining high-quality ARL and cermet layers.

The substrate used, AISI 316L, is an austenitic steel having C 0.021%, Cr 16.93%, Ni 10.48%, Mo 2.09%, Si 0.564%, Mn 1.121%. The presence of Mo makes it more resistant to corrosion with respect to AISI 304. Grade 316L, the version with a low carbon content of 316, is immune to the precipitation of carbide at grain boundaries. It can be used continuatively within the temperature range of 425° C.-860° C.

Alternatively, grade 316H could be used, with a higher carbon content, which has a greater mechanical resistance at temperatures>500° C.

The substrates are subjected to a surface polishing using an alumina-based abrasive paste, before being installed in the deposition chamber.

After insertion of the substrate on the sample-holder, it has been surprisingly found that coatings of W in α phase can be obtained without the use of matching layers. In order to obtain a layer of this type, the following conditions are necessary: 1) an initial vacuum level in the chamber which is sufficient for avoiding oxygen contaminations; 2) a pre-sputtering of the W target for a short time, in the order of 10'; 3) heating of the substrate, preferably to a temperature of 500° C.; 4) low-velocity oscillation, 0.5 cm/s, of the sample-holder above the W source; 5) a sufficient annealing, preferably for 1 hour, at the deposition temperature and same sputtering pressure.

In order to obtain the subsequent nanometric dispersion of W in a YPSZ matrix (layer(s) of CERMET), the heated sample-holder of FIG. 2 is oscillated at a high velocity, in the order of 10 cm/s, between one target and another.

In this case, the two sources, after a short pre-sputtering phase of the YPSZ target, remain simultaneously ignited at the same deposition pressure. A movable barrier (not shown in FIG. 2) prevents the W vapour from being deposited on the YPSZ target and viceversa, but does not interfere with the mixing of the two vapour flows towards the sample, which is typically heated to the same deposition temperature as the first layer (500° C.). Due to the considerable differences in sputtering yields between W and YPSZ, at the same distance from the sample-holder, one source (that of W) is substantially operated at minimum power (10-20 W), whereas the other (that of YPSZ) operates at around 55-60 W. Although YPSZ is the zirconia-based material with the highest mechanical resistance, it is not wise to exceed these power values due to thermo-mechanical stress which jeopardizes the integrity of the target. The duration of the deposition was optimized in 15÷20'. Also in this case, when the deposition is complete, an annealing phase is then carried out for a duration of 30' at the same deposition temperature and same sputtering pressure.

Alternatively, a double layer of cermet can be produced with a different W-YPSZ volumetric ratio. In this case, after deposition of the layer of W (back reflector) and pre-sputtering of YPSZ, by making the sample-holder to oscillate above the two targets, the sputtering power of the YPSZ source is kept constant (typically 55 W) and a first layer of cermet is obtained, applying a power of 25 W to the W source for a relatively short period (5÷10'). The power of the W source alone is then instantaneously lowered to 15 W and the deposition is carried out for 15-20'. Also in this case, an annealing phase is then carried out for a duration of 30' at the same deposition temperature and same sputtering pressure. The thickness of the double layer is less than 100 nm.

As a final layer, an ARL layer is deposited, consisting of pure YPSZ and having a thickness of around 100 nm, making the stainless steel substrate to oscillate above the RF source at a speed preferably ranging from 0.4 e 0.6 cm/s, depositing at the same temperature and sputtering pressure as the previous layers, and carrying out a final annealing of 30' at the same deposition pressure.

The morphological, structural and functional characterization of the films obtained was carried out with various techniques. In particular, the morphological characterization is performed with observations using a scanning electron microscope (SEM), on both the surface and also on the cross section. The observations are integrated with an image analysis program. Compositional mappings or in-line scans are also performed by means of EDS ("Energy Dispersive System"). The structural characterization is carried out by means of X-ray diffraction, in both θ-2θ configuration, and in GID configuration ("Grazing Index Diffraction"). The composition and thicknesses of the films are prevalently determined by means of X-ray fluorescence (XRF), with a MLQUANT program. The thicknesses are compared with those obtained from the SEM observations and by a Tencor profilometer. The functional characterization of the near-mid-infrared is carried out by means of a new-generation portable emissometer, the ET 100 Emissometer. The instrument, a reflectometer suitable for calculating the thermal emissivity of surfaces, was developed by Surface Optics Co. (San Diego, Calif., USA), in collaboration with "Naval Air Systems Command", the American NREL and NIST.

The instrument measures the integrated reflectance of a surface with two different incidence angles, 20° and 60° and in 6 wavelength bands within the spectral range of 1.5 µm to 21 µm. The bands are the following: 1.5-2.0 µm, 2.0-3.5 µm, 3.0-4.0 µm, 4.0-5.0 µm, 5.0-10.5 µm, 10.5-21.0 µm.

The integrating sphere captures the radiation reflected by the material (the head of the instrument can also adapt itself to curved surfaces) and gives the integral of the reflections in all directions. The detectors, filtered with respect to wavelengths, measure the total radiation reflected in each measurement band and convert it into an analogical signal. This is then converted into a digital signal and processed to determine the reflectance of the sample for each incidence angle and wavelength band. These reflectances are used for calculating the directional thermal emissivity values for both incidence angles, 20° and 60°. The results are expressed in:

near-normal directional emissivity, when the reflectance has been measured with an incidence at 20°;
high-angle directional emissivity, when the reflectance has been measured at 60°;
total hemispherical emissivity, when the reflectance has been measured within a range of incidence angles which is sufficiently wide for allowing integration on the hemisphere and calculating as $\epsilon_H = 2\int_0^{\pi/2} \epsilon(\theta) \sin\theta \cos\theta d\theta$.

In the examples, the emissivity calculated with reference to black body temperatures from 25 to 600° C., is indicated.

The reflectance measurements, within the range of 200 nm to 15,000 nm, are performed with a Perkin Elmer Lambda 950 UV-Vis-NIR (200-2500 nm) spectrophotometer equipped with an integrating sphere of 150 mm with an incidence angle of 8° and a Thermo Nicolet Nexus 670 FT-IR (5000-600 cm$^{-1}$) spectrophotometer equipped with an integrating sphere of 80 mm coated with gold.

Surveys on the atomic ratios of the cermet elements are effected by means of XPS ("X-Ray Photoelectron Spectroscopy").

Example 1 (Comparative)

The target is a disc of W 4 N having a diameter of 50.8±0.3 mm and a thickness of 3.18±0.2 mm, produced by Plansee. The substrate is an AISI 316L disc having a diameter of 70 mm and a thickness of 0.2 mm.
The deposition conditions were the following:
initial vacuum level in the chamber $4\times10^{-6}$ mbar;
heating of substrate: 500° C.;
target-substrate distance: 6 cm;
initial P.=$1.3\times10^{-5}$ mbar;
deposition P.=$3\times10^{-2}$ mbar (Ar 6N);
translation rate of substrate: 0.5 cm/s;
sputtering duration: 30';
V=370 V; I=300 mA; P=111 W.

The thickness measurements of this sample, sample 3, are shown in Table 1 and the emissivity measurements in Table 2. Table 1 also shows the thickness measurements of samples prepared with lower deposition times, samples 1 and 2.

Example 2

The target is a disc of W 4 N having a diameter of 50.8±0.3 mm and a thickness of 3.18±0.2 mm, produced by Plansee. The substrate is an AISI 316L disc having a diameter of 70 mm and a thickness of 0.2 mm.
Pre-Sputtering:
    initial P.=$4\times10^{-6}$ mbar;
    deposition P.=$8.5\times10^{-3}$ mbar (Ar 6N);
    V=320 V; I=60 mA;
    duration: 10'.
Sputtering:
    temperature of substrate: 500° C.;
    target-substrate distance: 6 cm;
    initial P.=$1\times10^{-5}$ mbar;
    deposition P.=$3\times10^{-2}$ mbar (Ar 6N);
    translation rate of substrate: 0.5 cm/s;
    V=360 V; I=440 mA; P=158.4 W;
    sputtering duration: 30'.
Annealing:
    temperature of substrate: 500° C.;
    P=$3\times10^{-2}$ mbar
    Duration: 1 h.

The thickness measurements of sample 4 are shown in Table 1 and the emissivity measurements in Table 2.

Comparing these data with those of example 1, it can be seen that, with the same thickness, the emissivity values are almost halved.

Example 3

The target is a disc of W 4 N having a diameter of 50.8±0.3 mm and a thickness of 3.18±0.2 mm, produced by Plansee. The substrate is an AISI 316L disc having a diameter of 70 mm and a thickness of 0.2 mm.
Pre-Sputtering:
    initial P.=$4\times10^{-6}$ mbar;
    deposition P.=$8.5\times10^{-3}$ mbar (Ar 6N);
    V=320 V; I=60 mA;
    duration: 10'.
Sputtering:
    temperature of substrate: 500° C.;
    target-substrate distance: 6 cm;
    initial P.=$1\times10^{-5}$ mbar;
    deposition P.=$3\times10^{-2}$ mbar (Ar 6N);
    translation rate of substrate: 0.5 cm/s;
    V=350 V; I=370 mA; P=129.5 W;
    sputtering duration: 30'.
Annealing:
    temperature of substrate: 500° C.;
    P=$3\times10^{-2}$ mbar
    Duration: 1 h.

The thickness measurements of sample 5 are shown in Table 1 and the emissivity measurements in Table 2.

Figure 3:
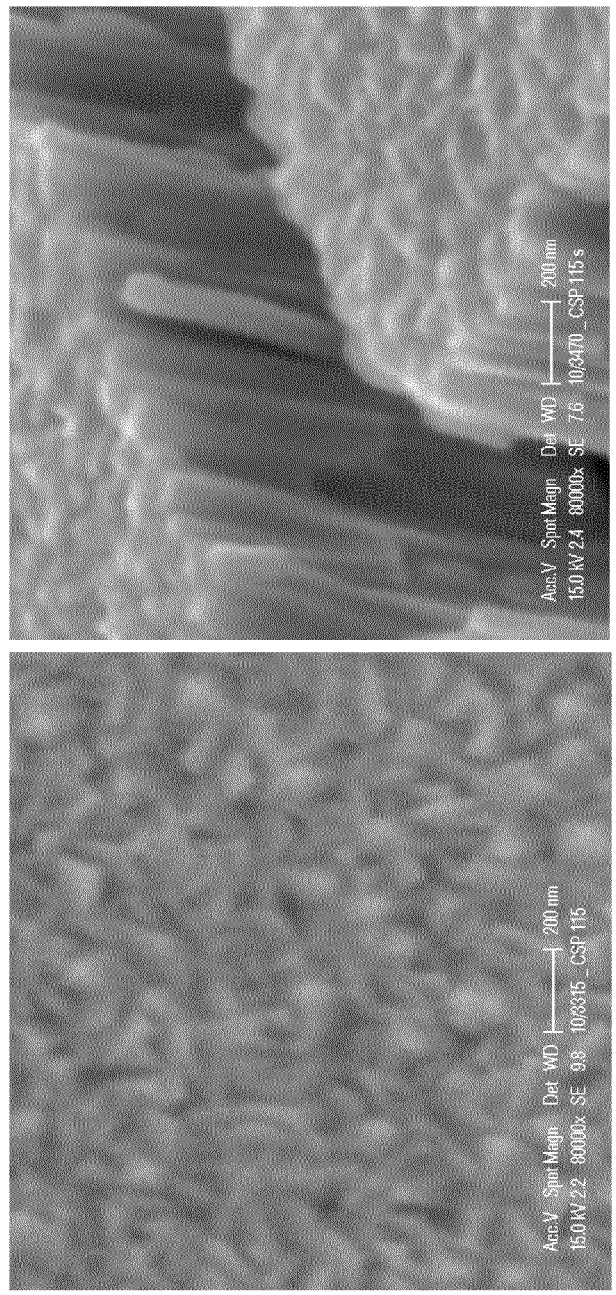
FIG. 3: Shows SEM photographs of the morphology of a W film obtained with these conditions: on the left, morphology of the surface (80000 X); on the right, morphology of the cross section obtained by cutting (80000 X). This is described in Example 3 of the specification.

FIG. 3 shows the morphology of the W film obtained with these conditions: on the left, morphology of the surface (80000×); on the right, morphology of the cross section obtained by cutting (80000×). The topography is clearly visible, also with medium-small magnifications (not shown): the particles become sharp, presumably as the growth proceeds, ordered according to crystallographic symmetry elements. On the section, the morphology of the film is extremely compact and a columnar structure is revealed.

Figure 4:
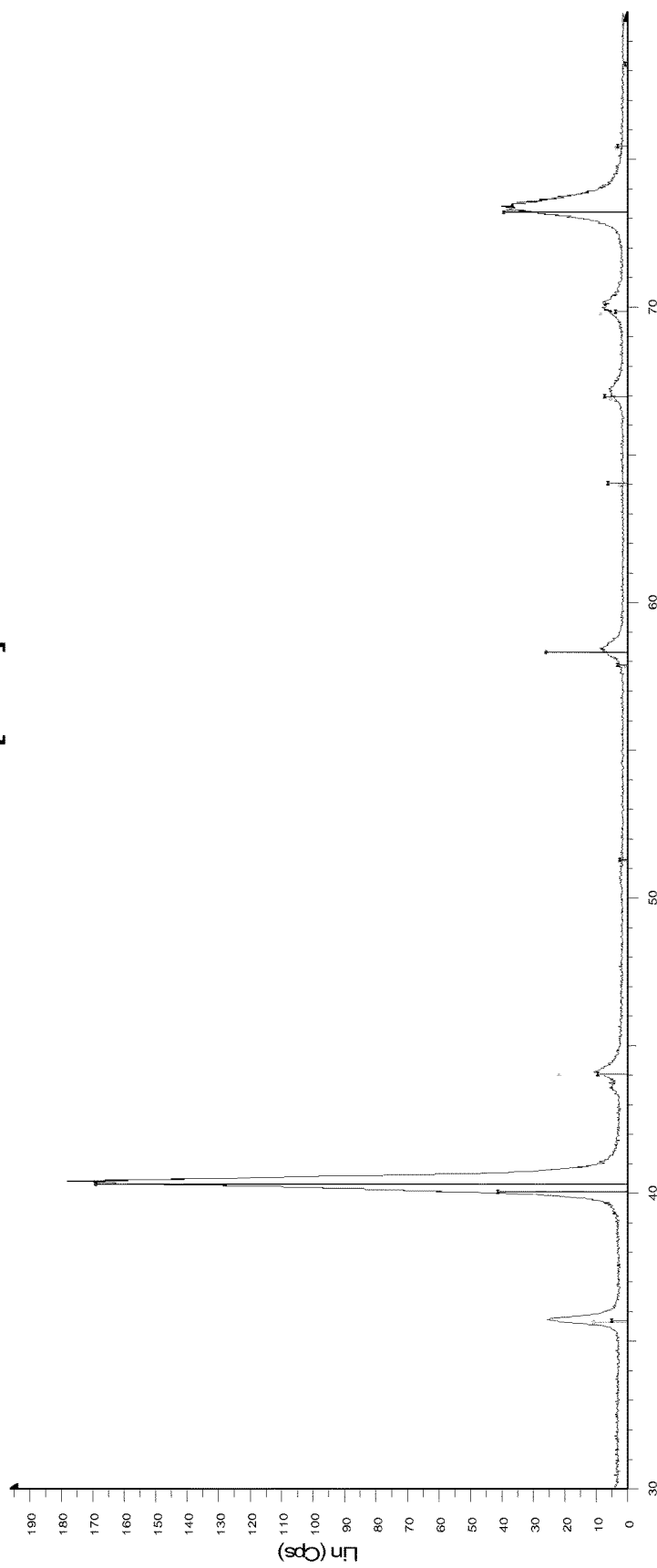
FIG. 4: Shows a figure resulting from X-Ray-diffractometry of the film as discussed in Example 3 of the specification.

FIG. 4 shows the X-Ray-diffractometry of the film in a GID configuration. The desired phase is α-W (file JCPDS 00-004-0806), with a centred body cubic structure and having the maximum reflectance in the IR region of the spectrum.

There is another metastable phase, called β-W with an A15 structure, which can be either $W_3W$ (file JCPDS 03-065-6453) or $W_3O$ (file JCPDS 01-073-2526), with peaks at angles 2-θ: 35.7°, 44.1°, 66.9° and 69.7. A semi-quantitative estimate of the relative abundance of the phases, obtained using the I/Ic ratio method gave a ratio of 88:12 between the "alpha" and "beta" phases.

Example 4

The targets are: a disc of W 4 N having a diameter of 50.8±0.3 mm and a thickness of 3.18±0.2 mm, produced by Plansee; b) a disc of YPSZ obtained by monodirectional pressing of Tosoh powders, having a diameter of 49 mm and a thickness of 3.5 mm. The substrate is a disc of AISI 316L having a diameter of 70 mm and a thickness of 0.2 mm.
Deposition of the 1$^{st}$ Layer of W
Pre-Sputtering:
    initial P.=$4\times10^{-6}$ mbar;
    deposition P.=$8.5\times10^{-3}$ mbar (Ar 6N);
    V=320 V; I=60 mA;
    duration: 10'.
Sputtering:
    temperature of substrate: 500° C.;
    target-substrate distance: 6 cm;
    initial P.=$1\times10^{-5}$ mbar;
    deposition P.=$3\times10^{-2}$ mbar (Ar 6N);
    translation rate of substrate: 0.5 cm/s;
    V=350 V; I=370 mA; P=129.5 W;
    sputtering duration: 30'.
Annealing:
    temperature of substrate: 500° C.;
    P=$3\times10^{-2}$ mbar
    Duration: 1 h.
Deposition of Cermet
Pre-Sputtering YPSZ:
    deposition P.=$3.3\times10^{-2}$ mbar (Ar 6N);
    duration: 10';
    RF: Forward Power 40 W W;
Combined DC/RF Sputtering:
    temperature of substrate: 500° C.;
    target-substrate distance: 6 cm;
    deposition P.=$3\times10^{-2}$ mbar (Ar 6N);
    translation rate of substrate between the two sources: 10 cm/s;

RF: Forward Power 55 W constant;
DC: V=290 V; I=90 mA; P=26.1 W.
overall duration: 11';
"annealing" at 500° C.×0.5 h at 3×10$^{-2}$ mbar (Ar 6N).

The emissivity measurements of sample 6 are shown in Table 2. A comparison with the emissivity of sample (example 4) reveals a marked decrease in the emissivity due to the deposition of the layer of cermet.

Example 5

The targets are: a disc of W 4 N having a diameter of 50.8±0.3 mm and a thickness of 3.18±0.2 mm, produced by Plansee; b) a disc of YPSZ obtained by monodirectional pressing of Tosoh powders, having a diameter of 49 mm and a thickness of 3.5 mm. The substrate is a disc of AISI 316L having a diameter of 70 mm and a thickness of 0.2 mm.
Deposition of the 1$^{st}$ Layer of W
Pre-Sputtering:
   initial P.=4×10$^{-6}$ mbar;
   deposition P.=8.5×10$^{-3}$ mbar (Ar 6N);
   V=320 V; I=60 mA;
   duration: 10'.
Sputtering:
   temperature of substrate: 500° C.;
   target-substrate distance: 6 cm;
   initial P.=1×10$^{-5}$ mbar;
   deposition P.=3×10$^{-2}$ mbar (Ar 6N);
   translation rate of substrate: 0.5 cm/s; V=350 V; I=370 mA; P=129.5 W;
   sputtering duration: 30'.
Annealing:
   temperature of substrate: 500° C.;
   P=3×10$^{-2}$ mbar
   Duration: 1 h.
Deposition of Cermet
Pre-Sputtering YPSZ:
   deposition P.=3.3×10$^{-2}$ mbar (Ar 6N);
   duration: 10';
   RF: Forward Power 40 W;
Combined DC/RF Sputtering:
   temperature of substrate: 500° C.;
   target-substrate distance: 6 cm;
   deposition P.=3×10$^{-2}$ mbar (Ar 6N);
   translation rate of substrate between the two sources: 10 cm/s;
   RF: Forward Power 55 W constant;
   DC: V=270 V; I=50 mA; P=13.5 W.
   overall duration: 11';
   annealing at 500° C.×0.5 h at 3×10$^{-2}$ mbar (Ar 6N).

The emissivity measurements of sample 7 are shown in Table 2.

Example 6

The targets are: a disc of W 4 N having a diameter of 50.8±0.3 mm and a thickness of 3.18±0.2 mm, produced by Plansee; b) a disc of YPSZ obtained by monodirectional pressing of Tosoh powders, having a diameter of 49 mm and a thickness of 3.5 mm. The substrate is a disc of AISI 316L having a diameter of 70 mm and a thickness of 0.2 mm.
Deposition of the 1$^{st}$ Layer of W
Pre-Sputtering:
   initial P.=4×10$^{-6}$ mbar;
   deposition P.=8.5×10$^{-3}$ mbar (Ar 6N);
   V=320 V; I=125 mA;
   duration: 10'.
Sputtering:
   temperature of substrate: 500° C.;
   target-substrate distance: 6 cm;
   initial P.=1×10$^{-5}$ mbar;
   deposition P.=3×10$^{-2}$ mbar (Ar 6N);
   translation rate of substrate: 0.5 cm/s;
   V=314 V; I=415 mA; P=130.3 W;
   sputtering duration: 30'.
Annealing:
   temperature of substrate: 500° C.;
   P=3×10$^{-2}$ mbar
   Duration: 0.5 h.
Deposition of Cermet
Pre-Sputtering YPSZ:
   deposition P.=3.0×10$^{-2}$ mbar (Ar 6N);
   duration: 10';
   RF: Forward Power 45 W;
Combined DC/RF Sputtering:
   temperature of substrate: 500° C.;
   target-substrate distance: 6 cm;
   deposition P.=3×10$^{-2}$ mbar (Ar 6N);
   translation rate of substrate between the two sources: 10 cm/s;
   RF: Forward Power 55 W constant;
   DC: V=248 V, I=61 mA; P=15.1 W.
   overall duration: 18'45";
   annealing at 500° C.×0.5 h at 3×10$^{-2}$ mbar (Ar 6N).

The emissivity measurements of sample 8 are shown in Table 2.

Example 7

The targets are: a disc of W 4 N having a diameter of 50.8±0.3 mm and a thickness of 3.18±0.2 mm, produced by Plansee; b) a disc of YPSZ obtained by monodirectional pressing of Tosoh powders, having a diameter of 49 mm and a thickness of 3.5 mm. The substrate is a disc of AISI 316L having a diameter of 70 mm and a thickness of 0.2 mm.
Deposition of the 1$^{st}$ Layer of W
Pre-Sputtering:
   initial P.=4×10$^{-6}$ mbar;
   deposition P.=8.5×10$^{-3}$ mbar (Ar 6N);
   V=320 V; I=125 mA;
   duration: 10'.
Sputtering:
   temperature of substrate: 500° C.;
   target-substrate distance: 6 cm;
   initial P.=1×10$^{-5}$ mbar;
   deposition P.=3×10$^{-2}$ mbar (Ar 6N);
   translation rate of substrate: 0.5 cm/s;
   V=391 V; I=333 mA; P=130.2 W;
   sputtering duration: 30'.
Annealing:
   temperature of substrate: 500° C.;
   P=3×10$^{-2}$ mbar
   Duration: 0.5 h.
Deposition of Cermet 1
Pre-Sputtering YPSZ:
   deposition P.=3.0×10$^{-2}$ mbar (Ar 6N);
   duration: 10';
   RF: Forward Power 45 W;
Combined DC/RF Sputtering:
   temperature of substrate: 500° C.;
   target-substrate distance: 6 cm;
   deposition P.=3×10$^{-2}$ mbar (Ar 6N);
   translation rate of substrate between the two sources: 10 cm/s;

RF: Forward Power 55 W constant;
DC: V=303 V, I=85 mA; P=25.8 W.
overall duration: 7'30";
Deposition of Cermet 2
Combined DC/RF Sputtering:
  temperature of substrate: 500° C.;
  target-substrate distance: 6 cm;
  deposition P.=3×10$^{-2}$ mbar (Ar 6N);
  translation rate of substrate between the two sources: 10 cm/s;
  RF: Forward Power 55 W constant;
  DC: V=242 V, I=52 mA; P=12.5 W.
  overall duration: 20';
Annealing:
  temperature of substrate: 500° C.;
  P=3×10$^{-2}$ mbar
  Duration: 0.5 h.

The emissivity measurements of sample 9 are shown in Table 2.

The following observations relate to two or more of the previous examples.

Table 1 indicates the thickness data of tungsten films alone obtained by means of a Tencor profilometer, the X-ray-fluorescence (XRF) analysis and SEM observations. The measurements substantially are in a good accordance with each other, except for sample 2. Table 2 shows the hemispherical emissivity data ($\epsilon_H$), measured with an ET 100 emissometer at the various temperatures within the range of 25° C.-600° C. The table also shows, for comparative purposes, the emissivity data of the AISI 316L substrate and a bulk W (W target). Samples 3, 4, 5 are three films of W having a comparable thickness (see Table 1), but obtained under different operating conditions (see Examples 1÷3). The emissivity values of a good layer of W reflecting in the infrared should be as close as possible to those of a massive substrate of W. Some of the films obtained, in fact, in particular sample 4, are close to these functional characteristics. A comparison between the measurements of samples 4 and 3, having analogous thicknesses and whose preparation procedures are described in Examples 2 and 1, respectively, demonstrate what is claimed, i.e. that coatings of W in α phase can be obtained without the use of matching layers.

Sample 5, obtained under similar conditions to sample 4, except for a slightly lower sputtering power, represents a repeatability test of the data obtained from the previous test.

Samples 6, 7, 8 are bi-layers with the back reflector and a single layer of cermet (see Examples 4÷6). Sample 9 is a tri-layer with the back reflector and a double layer of cermet (see Example 7). All the samples 6, 7, 8 and 9, show lower emissivity measurements than those of the bulk W. In particular, sample 9 with two layers of cermet shows particularly interesting characteristics up to 600° C. The morphological observations using SEM (not shown, on the cross section, show a compact multilayer with a columnar structure, in which no discontinuity between the various layers can be found.

Figure 5:
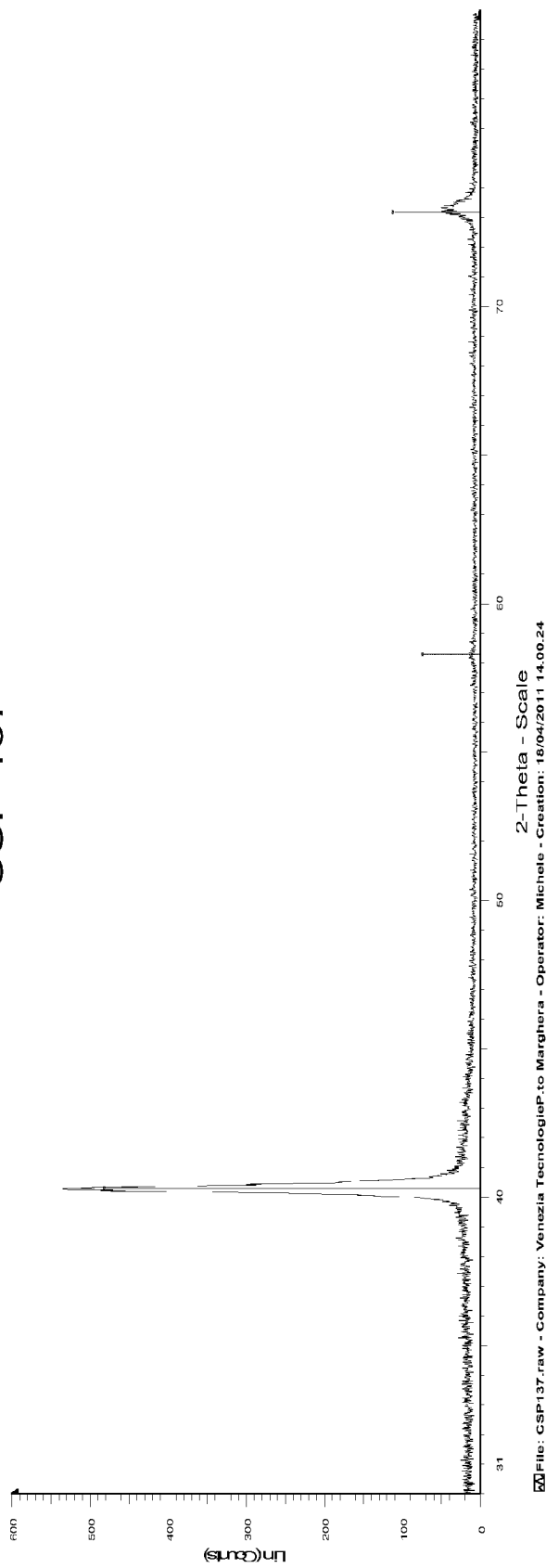
FIG. 5: Shows a figure resulting from X-Ray-diffractometry of a bi-layer (first layer: W; second layer: W-YPSZ cermet) (Samples 6-7-8), as described in Example 7 of the specification.

FIG. 5 shows the X-Ray-diffractometry of a bi-layer in GID configuration (first layer: W; second layer: W-YPSZ cermet) (Samples 6-7-8). Peaks of W in alpha phase can be exclusively observed, which could imply that the layer of cermet is amorphous.

Figure 6:
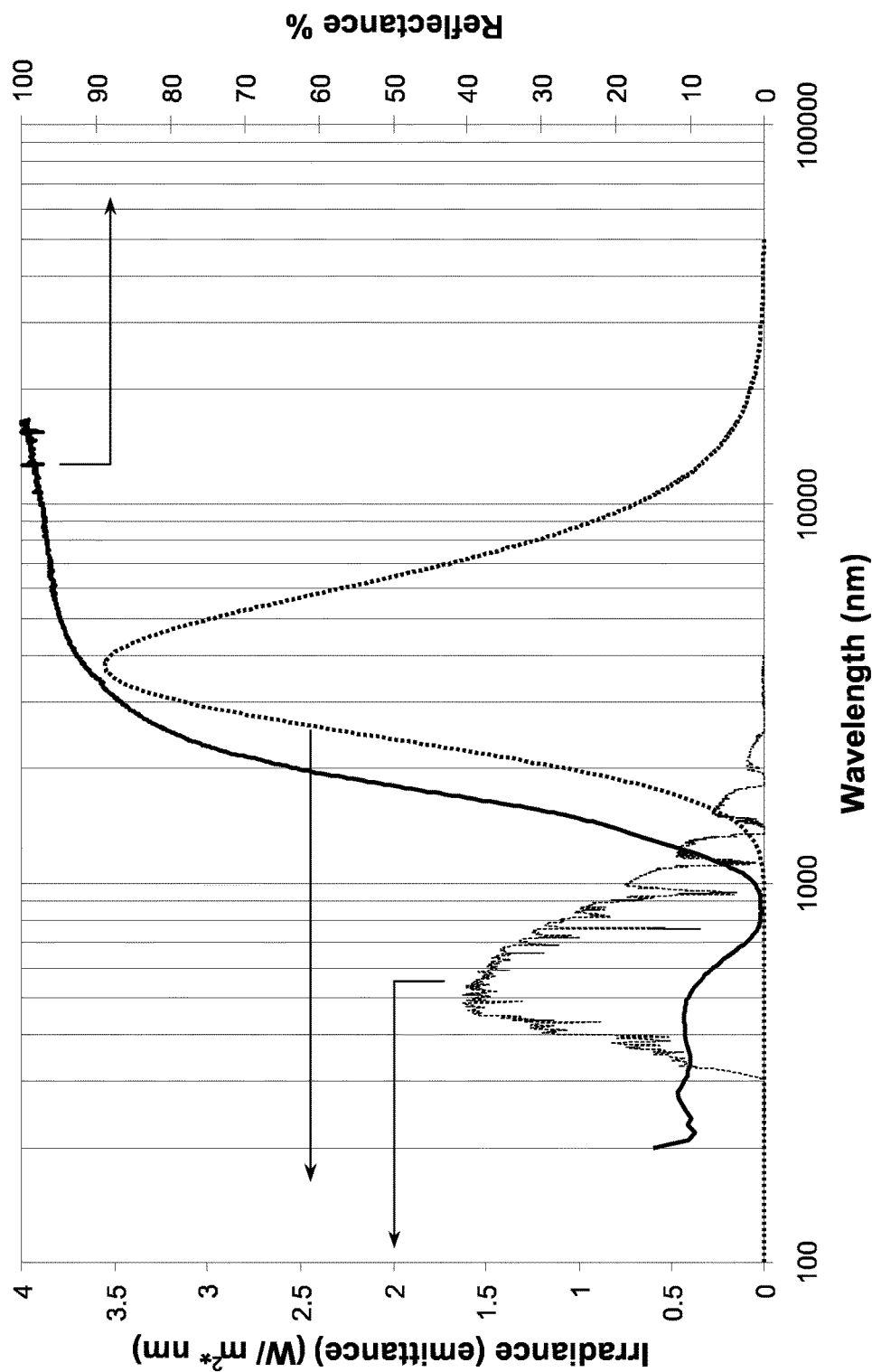
FIG. 6: Shows a reflectance spectrophotometric measurement of sample 9, as discussed in Example 7 of the specification.

The reflectance spectrophotometric measurement of sample 9 (Example 7) is shown in FIG. 6 (continuous curve in the centre) together with the global tilt solar irradiance profiles AM 1.5 (dashed curve on the left) and black body emittance profiles at 550° C. (dotted curve on the right). An absorptance value α equal to 0.893 and an emissivity value equal to 0.087, are calculated from the reflectance spectrum.

TABLE 1

Measurements of the thickness of the W layer by means of a profilometer, X-ray-fluorescence analysis and SEM observations

| Samples | Tencor profilometer (nm) | XRF (nm) | SEM (nm) |
|---|---|---|---|
| 1 | 141 ± 6 | 180 ± 15 | 200 |
| 2 | 348 ± 21 | 515 ± 25 | 640 |
| 3 | 850 ± 26 | 850 ± 50 | 890 |
| 4 | 850 ± 82 | 790 ± 50 | 920 |
| 5 | 844 ± 16 | 900 ± 50 | 900 |

TABLE 2

Hemispherical emissivity measurements ($\epsilon_H$) measured at various temperatures with an ET 100 emissometer

| Sample | 25° C. | 100° C. | 200° C. | 300° C. | 400° C. | 500° C. | 600° C. |
|---|---|---|---|---|---|---|---|
| AISI 316L | 0.120 ± 0.004 | 0.132 ± 0.003 | 0.143 ± 0.002 | 0.157 ± 0.001 | 0.167 ± 0.002 | 0.177 ± 0.003 | 0.185 ± 0.003 |
| W Bulk | 0.062 ± 0.002 | 0.066 ± 0.003 | 0.068 ± 0.004 | 0.080 ± 0.002 | 0.088 ± 0.002 | 0.103 ± 0.005 | 0.109 ± 0.003 |
| 3 (SS + W) | 0.168 ± 0.005 | 0.175 ± 0.008 | 0.187 ± 0.002 | 0.198 ± 0.003 | 0.211 ± 0.004 | 0.215 ± 0.008 | 0.227 ± 0.011 |
| 4 (SS + W) | 0.088 ± 0.005 | 0.092 ± 0.004 | 0.095 ± 0.002 | 0.104 ± 0.006 | 0.110 ± 0.006 | 0.115 ± 0.004 | 0.122 ± 0.007 |
| 5 (SS + W) | 0.086 ± 0.005 | 0.097 ± 0.004 | 0.099 ± 0.005 | 0.113 ± 0.006 | 0.118 ± 0.004 | 0.136 ± 0.005 | 0.140 ± 0.007 |
| 6(SS + W + Cer) | 0.043 ± 0.002 | 0.050 ± 0.003 | 0.054 ± 0.003 | 0.061 ± 0.001 | 0.071 ± 0.005 | 0.081 ± 0.002 | 0.092 ± 0.004 |
| 7(SS + W + Cer) | 0.053 ± 0.003 | 0.059 ± 0.004 | 0.064 ± 0.006 | 0.070 ± 0.005 | 0.080 ± 0.006 | 0.092 ± 0.005 | 0.103 ± 0.002 |
| 8(SS + W + Cer) | 0.050 ± 0.004 | 0.057 ± 0.003 | 0.060 ± 0.003 | 0.068 ± 0.005 | 0.077 ± 0.007 | 0.089 ± 0.005 | 0.097 ± 0.006 |
| 9(SS + W + Cer1 + Cer2) | 0.053 ± 0.003 | 0.054 ± 0.001 | 0.057 ± 0.002 | 0.063 ± 0.002 | 0.068 ± 0.002 | 0.084 ± 0.001 | 0.091 ± 0.001 |

The invention claimed is:

1. A process for the production of an optically selective coating of a receiver substrate of suitable material for solar receivers suitable for operating at high temperatures comprising:
  deposition of a layer reflecting infrared radiation including W metal prevalently in the alpha phase on said heated receiver substrate at a temperature from 400° C. to 600° C.;
  annealing under the same temperature and pressure conditions as the deposition of the reflecting layer;
  deposition on the W metal prevalently in the alpha phase of one or more layers of metal-ceramic composite materials (CERMET), wherein the ceramic matrix includes YPSZ ("Yttria-Partially Stabilized Zirconia");
  deposition on the cermet of an antireflection layer;
  annealing under the same temperature and pressure conditions as the depositions of the cermet and antireflection layers;

wherein the reflecting layer of W is prepared without any previous deposition of a matching layer.

2. The process according to claim 1, wherein said solar receivers are composed of receiver tubes of linear parabolic troughs.

3. The process according to claim 1, wherein the antireflection layer includes YPSZ.

4. The process according to claim 1, wherein the depositions of the reflecting layer, the cermet layer and antireflection layer are carried out by means of simultaneous DC/RF sputtering in a single chamber with movement of the substrate or receiver tube.

5. The process according to claim 1, wherein the substrate or receiver tube includes stainless steel.

6. The process according to claim 5, wherein the substrate or receiver tube is polished by a suitable abrasive paste with dimensions not greater than 0.20 microns.

7. The process according to claim 3, wherein the infrared-reflecting layer including W is prepared by means of the following steps in sequence:
initial vacuum level in the chamber sufficient for preventing oxygen contaminations;
pre-sputtering of the W target;
heating of the substrate;
sputtering and low-velocity oscillation of the substrate above the source of W;
annealing at the same deposition temperature and at the same sputtering pressure.

8. The process according to claim 1, wherein the layer of W is prepared according to the following conditions:
the initial vacuum level in the chamber at a pressure ranging from $1\times10^{-6}$ mbar to $5\times10^{-6}$ mbar;
heating of the substrate or receiver tube from 400° C. to 600° C.;
sputtering at a pressure ranging from $2.7\times10^{-2}$ mbar to $3.2\times10^{-2}$ mbar (Ar 6N), contemporaneously making the substrate oscillate above the DC source at low speed ranging from 0.1 cm/s to 1 cm/s;
annealing for a time ranging from 0.5 h to 2 h at the same temperature and pressure as the sputtering;
so as to obtain the layer of W, prevalently in alpha phase, with a thickness ranging from 200 nm to 900 nm.

9. The process according to claim 1, wherein the layer of cermet deposited includes W dispersed on a nanometric scale, in an amount ranging from 30 to 70% by volume, in a matrix of YPSZ, in an amount ranging from 70% to 30% by volume.

10. The process according to claim 9, wherein the layer of cermet is prepared by steps including the following steps in sequence:
pre-sputtering of the YPSZ target;
heating of the substrate or receiver tube;
sputtering and oscillation of the substrate so as to expose it alternatingly to the W and YPSZ sources.

11. The process according to claim 1, wherein a second layer of cermet including W dispersed on a nanometric scale is deposited, in an amount ranging from 20 to 60% by volume, in a matrix of YPSZ, in an amount ranging from 80 to 40% by volume, the volume percentage of W in said second layer being lower with respect to the layer of cermet previously deposited.

12. The process according to claim 11, wherein the second layer of cermet is prepared by means of the following steps in sequence:
heating of the substrate or receiver tube;
sputtering and oscillation of the substrate so as to expose it alternatingly to the W and YPSZ sources.

13. The process according to claim 10, wherein the layer of cermet is prepared by carrying out the pre-sputtering of the YPSZ target at a low power, and for a short time.

14. The process according to claim 10, wherein the layer of cermet or a second layer of cermet is prepared according to the following conditions:
heating of the substrate or receiver tube from 400° C. to 600° C.;
sputtering at a pressure ranging from $2.7\times10^{-2}$ mbar to $3.2\times10^{-2}$ mbar (Ar 6N), contemporaneously making the substrate oscillate so as to expose it alternately to the DC and RF sources at a high velocity ranging from 5 cm/s to 15 cm/s.

15. The process according to claim 1, wherein said antireflection layer (ARL) including YPSZ is deposited on the layer of cermet or on a second layer of cermet.

16. The process according to claim 15, wherein the ARL is prepared by means of the following steps in sequence:
heating of the substrate or receiver tube;
sputtering and oscillation of the substrate at a low velocity above the RF source of YPSZ;
annealing at the deposition temperature and at the same sputtering pressure for a time ranging from 0.2 h to 1 h.

17. The process according to claim 16, wherein the ARL is prepared assuring the following conditions:
heating of the substrate or receiver tube within the range of 400° C.-600° C. wherein the substrate or receiver tube includes stainless steel;
sputtering at a pressure ranging from $2.7\times10^{-2}$ mbar to $3.2\times10^{-2}$ mbar (Ar 6N), contemporaneously making the substrate oscillate above the RF source at a low velocity ranging from 0.1 cm/s to 1 cm/s, or rotating and simultaneously translating the receiver tube, maintaining the YPSZ source fixed;
annealing for a time ranging from 0.2 h to 1 h, at the same deposition temperature and at the same sputtering pressure.

18. An optically selective multilayer coating material of receiver substrates obtained by a method according to claim 1 comprising:
an upper layer of antireflection material;
a lower layer of material reflecting in the infrared including W prevalently in the alpha phase;
at least one intermediate layer of metal-ceramic composite material (CERMET), wherein the metal includes W and the ceramic matrix includes YPSZ ("Yttria-Partially Stabilized Zirconia"),
wherein the lower layer of W is prepared without any previous deposition of a matching layer.

19. The material according to claim 18, wherein the antireflection material includes YPSZ, the W in the cermet ranging from 20% to 70% by volume and the ceramic YPSZ matrix ranging from 80% to 30% by volume.

20. The material according to claim 18, characterized in that it has α absorptance and $\epsilon_H$ hemispherical emissivity values, at a temperature of 550° C., of 0.893 and 0.087, respectively.

* * * * *